United States Patent
Shin

(10) Patent No.: US 9,496,677 B2
(45) Date of Patent: Nov. 15, 2016

(54) APPARATUS AND METHOD FOR GENERATING BURST-MODE LASER

(71) Applicant: GWANGJU INSTITUTE OF SCIENCE AND TECHNOLOGY, Gwangju (KR)

(72) Inventor: Woo Jin Shin, Gwangju (KR)

(73) Assignee: GWANGJU INSTITUTE OF SCIENCE AND TECHNOLOGY, Gwangju (KR)

(*) Notice: Subject to any disclaimer, the term of this patent is extended or adjusted under 35 U.S.C. 154(b) by 0 days.

(21) Appl. No.: 14/894,986

(22) PCT Filed: Dec. 27, 2013

(86) PCT No.: PCT/KR2013/012244
§ 371 (c)(1),
(2) Date: Nov. 30, 2015

(87) PCT Pub. No.: WO2014/193062
PCT Pub. Date: Dec. 4, 2014

(65) Prior Publication Data
US 2016/0111849 A1   Apr. 21, 2016

(30) Foreign Application Priority Data

May 31, 2013 (KR) .................. 10-2013-0062752
Aug. 5, 2013 (KR) .................. 10-2013-0092661

(51) Int. Cl.
*H01S 3/10* (2006.01)
*H01S 3/13* (2006.01)
(Continued)

(52) U.S. Cl.
CPC .......... *H01S 3/1302* (2013.01); *H01S 3/0057* (2013.01); *H01S 3/06754* (2013.01); *H01S 3/10* (2013.01);
(Continued)

(58) Field of Classification Search
CPC ............... H01S 3/1302; H01S 3/10; H01S 3/0057; H01S 5/0608; H01S 5/0609;
(Continued)

(56) References Cited

U.S. PATENT DOCUMENTS 5,920,393 A * 7/1999 Kaplan ............... G01J 4/00
356/364
8,462,426 B1 * 6/2013 Dajani ............... H01S 3/06754
359/334
(Continued)

FOREIGN PATENT DOCUMENTS

JP  2005077470 A  3/2005
JP  2007049083 A  2/2007
(Continued)

OTHER PUBLICATIONS

International Search Report for PCT/KR2013/012244 mailed on Mar. 10, 2014, citing the above reference(s).

*Primary Examiner* — Yuanda Zhang
(74) *Attorney, Agent, or Firm* — Hauptman Ham, LLP

(57) ABSTRACT

An apparatus for generating burst-mode laser includes: a trigger signal generator for generating a burst trigger signal; a first light source for generating a first optical signal in a form of pulse; a second light source for generating a second optical signal in the form of pulse; an optical switch for selecting between the first optical signal and the second optical signal according to the burst trigger signal to output the selected one; an optical amplifier for amplifying the optical signal output from the optical switch; and a wavelength tuner for tuning a wavelength of the optical signal amplified by the optical amplifier. An oscillation line-width and/or a polarization state of the first optical signal are different from an oscillation line-width and/or a polarization state of the second optical signal.

11 Claims, 2 Drawing Sheets

(51) Int. Cl.
H01S 5/40 (2006.01)
H01S 5/06 (2006.01)
H01S 3/00 (2006.01)
H01S 3/067 (2006.01)

(52) U.S. Cl.
CPC ......... H01S 3/10015 (2013.01); H01S 5/0608 (2013.01); H01S 5/0609 (2013.01); H01S 5/40 (2013.01); H01S 5/4012 (2013.01); *H01S 3/0092* (2013.01)

(58) Field of Classification Search
CPC ....................... H01S 5/40; H01S 5/4012; H01S 3/06754; H01S 3/10015; H01S 3/0092
See application file for complete search history.

(56) References Cited

U.S. PATENT DOCUMENTS

2010/0177794 A1* 7/2010 Peng ..................... H01S 3/2316
372/25
2013/0215494 A1* 8/2013 Shin ......................... H01S 3/11
359/326
2014/0049811 A1* 2/2014 Noh ..................... H01S 3/0092
359/341.1

FOREIGN PATENT DOCUMENTS

KR 1020020048230 A 6/2002
KR 1020120122102 A 11/2012

* cited by examiner

APPARATUS AND METHOD FOR GENERATING BURST-MODE LASER

CROSS REFERENCE TO RELATED APPLICATION

This application claims the priority of Korean Patent Application No. 10-2013-0062752 filed on May 31, 2013 and Korean Patent Application No. 10-2013-0092661 filed on Aug. 5, 2013 in the KIPO (Korean Intellectual Property Office). Further, this application is the National Phase application of International Application No. PCT/KR2013/012244 filed on Dec. 27, 2013, which designates the United States and was published in Korean.

TECHNICAL FIELD

The present disclosure relates to an apparatus and a method for generating burst-mode laser. More specifically, the present disclosure relates to an apparatus and a method for generating burst-mode laser capable of implementing a burst-mode in a wavelength-tunable laser by adjusting an oscillation line-width and a polarization state of an oscillating light source.

BACKGROUND ART

In a variety of applications of optical fiber lasers emitting light in the form of pulses (pulsed optical fiber lasers), it is often required to randomly-modulate pulse trains (burst-mode). It is difficult to implement such a burst-mode when a high-energy optical fiber amplifier is employed in a pulsed optical fiber laser for obtaining high output energy, because the amplifier may be damaged due to overamplification.

As a reference related to a burst-mode laser, Korean Patent Laid-Open publication No. 2012-0122102 discloses a pulse laser device that includes a laser source outputting an optical pulse and a laser source for outputting a continuous light and controls the duration of the continuous light to thereby maintain the profile of optical pulse trains coherently, and a method for controlling the device.

In the state-of-the-art, as an approach for implementing a burst-mode in an optical fiber laser, an optical modulator is disposed at the end output stage for preventing damage to an optical fiber amplifier and ensuring stability of a laser system.

Unfortunately, the approach requires employing expensive additional devices for driving the optical modulator, and thus the system becomes complicated and expensive. Moreover, the approach harms flexible operation requirements and high durability of an optical fiber laser, and consumes much power for driving the optical modulator.

DISCLOSURE

Technical Problem

It is an aspect of the present disclosure to provide an apparatus and a method for generating burst mode laser capable of implementing a burst mode in a wavelength-tunable laser by adjusting an oscillation line-width and/or a polarization state of an oscillating light source.

Technical Solution

In accordance with one aspect of the present disclosure, an apparatus for generating burst-mode laser includes: a trigger signal generator for generating a burst trigger signal; a first light source for generating a first optical signal in a form of pulse; a second light source for generating a second optical signal in the form of pulse; an optical switch for selecting between the first optical signal and the second optical signal according to the burst trigger signal to output the selected one; an optical amplifier for amplifying the optical signal output from the optical switch; and a wavelength converter for converting a wavelength of the optical signal amplified by the optical amplifier, wherein an oscillation line-width and/or a polarization state of the first optical signal is different from an oscillation line-width and/or a polarization state of the second optical signal.

The first and the second light sources may be laser diodes.

The oscillation line-width of the first optical signal may be narrower than that of the second optical signal.

The line-width of the first optical signal may be 1 nm or less, and the line-width of the second optical signal may be 10 nm or more.

The first optical signal may be polarized in an orientation, and the second optical signal may be unpolarized.

The optical switch may be configured to: select the first optical signal to transmit it to the optical amplifier if a level of the burst trigger signal is high, and select the second optical signal to transmit it to the optical amplifier if the level of the burst trigger signal is low.

The wavelength converter may be configured to tune the wavelength of the amplified optical signal non-linearly.

In accordance with one aspect of the present disclosure, a method for generating burst-mode laser includes: (a) generating a first optical signal that has a narrow oscillation line-width and is polarized and a second optical signal that has a broad oscillation line-width and is unpolarized; (b) generating a burst trigger signal; (c) selecting between the first optical signal and the second optical signal according to the burst trigger signal, to output the selected one; (d) amplifying the output optical signal; and (e) tuning a wavelength of the amplified optical signal non-linearly.

The generating a burst trigger signal may include generating the burst trigger signal in the same form as a wavelength of a desired burst mode.

The selecting between the first optical signal and the second optical signal may include selecting the first optical signal to transmit it to the optical amplifier if a level of the burst trigger signal is high and selecting the second optical signal to transmit it to the optical amplifier if the level of the burst trigger signal is low.

Advantageous Effects

According to an exemplary embodiment of the present disclosure, a burst mode can be implemented in a wavelength-tunable laser by adjusting an oscillation line-width and a polarization state of an oscillating light source.

In addition, it is possible to prevent damage to an amplifier due to overamplification and instability in a laser output.

In addition, according to an exemplary embodiment of the present disclosure, it is not necessary to keep adjusting the magnitude of an output from a continuously-oscillating laser, which has to be done in an existing continuously-oscillating laser for compensating for gain differences in an optical fiber amplifier according to a burst duty ratio or a formation time.

In addition, since an all-optical fiber laser system can be manufactured, the apparatus according to the exemplary embodiment of the present disclosure can have all of the advantages that optical fiber laser systems have, such as good operation requirements, durability, compactness and lightness.

Furthermore, the apparatus according to the exemplary embodiment of the present disclosure can have a simple configuration and thus is easy to manufacture. Accordingly, manufacturing cost can be saved and thus the apparatus is cost-efficient.

BEST MODE

Figure 1:
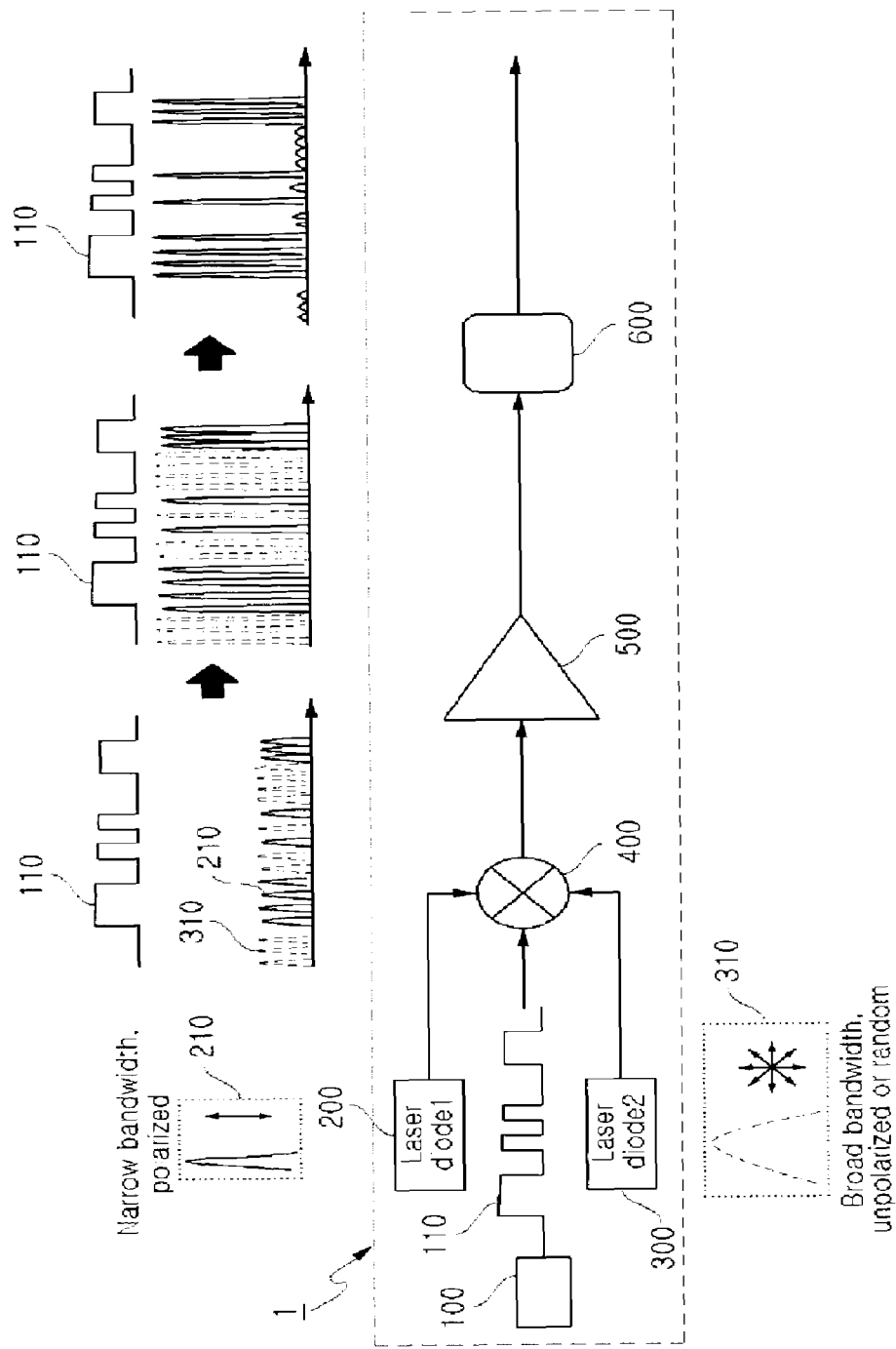
FIG. 1 is a view schematically showing a configuration of an apparatus for generating burst-mode laser according to an exemplary embodiment of the present disclosure.

Hereinafter, exemplary embodiments of the present disclosure will be described in detail with reference to the accompanying drawings. It is to be noted that like reference numerals designate like elements throughout the drawings. In the following descriptions, the present disclosure will be described with reference to exemplary embodiments thereof. It will, however, be evident that the technical idea of the present disclosure is not limited to the exemplary embodiments but various modifications and changes may be made by those skilled in the art.

In existing wavelength-tunable lasers, a burst-mode is implemented in the same way as in pulsed optical fiber lasers. However, it has been found that it is possible to implement a burst-mode in a wavelength-tunable laser with pulse signals that have the same amplitude but have different oscillation line-widths and polarization properties, by making use of wavelength conversion characteristics of a wavelength converter using non-linearity.

Accordingly, the inventors of the application have devised a technique to implement a burst mode in a wavelength-tunable laser by adjusting oscillation line-widths and polarization states of oscillating light sources, unlike the existing modulation scheme in which an optical modulator is disposed at the end output stage.

FIG. 1 is a view schematically showing a configuration of an apparatus for generating burst-mode laser according to an exemplary embodiment of the present disclosure.

Referring to FIG. 1, an apparatus 1 for generating burst-mode laser according to an exemplary embodiment of the present disclosure includes a trigger signal generator 100 for generating a burst trigger signal 110; a first laser diode 200 for generating a first optical signal 210 in the form of pulse; a second laser diode 300 for generating a second optical signal 310 in the form of pulse; an optical switch 400 for selecting between the first optical signal 210 and the second optical signal 310 according to the burst trigger signal 110 to output the selected one; and an optical amplifier 500 for amplifying the optical signal output from the optical switch 400; and a wavelength converter 600 for converting the wavelength of the optical signal amplified by the optical amplifier 500.

The trigger signal generator 100 generates a burst trigger signal 110. The burst trigger signal 110 is generated in the same form as a waveform of a desired burst-mode (random pulse train modulation).

The first laser diode 200 and the second laser diode 300 generate a first optical signal 210 and a second optical signal 310 in the form of pulse signals, respectively. The first optical signal 210 and the second optical signal 310 are input to the optical switch 400.

According to the present disclosure, the first optical signal 210 and the second optical signal 310 have the same amplitude and have different oscillation line-widths and/or polarization states.

In this exemplary embodiment of the present disclosure, the first laser diode 200 outputs the first optical signal 210 in the form of pulses that has a narrow oscillation line-width and is polarized. The laser diode 300 outputs the second optical signal 310 in the form of pulses that has a broad oscillation line-width and is unpolarized For example, the line-width of the first optical signal 210 may be 1 nm or less, and the line-width of the second optical signal 310 may be 10 nm or more. The line-widths of the first optical signal 210 and the second optical signal 310 may vary depending on the characteristics of the wavelength converter 600, which will be described below.

The burst trigger signal 110 generated by the trigger signal generator 100 and the first optical signal 210 and the second optical signal 310 generated by the first laser diode 200 and the second diode 300, respectively, are transmitted to the optical switch 400.

The optical switch 400 switches the optical signals so that the first optical signal 210 or the second optical signal 310 is input to the optical amplifier 500 according to the burst trigger signal 110 input thereto. Specifically, the optical switch 400 selects the first optical signal 210 to transmit it to the optical amplifier 500 when the level of the burst trigger signal 110 is high. In addition, the optical switch 400 selects the second optical signal 310 to transmit it to the optical amplifier 500 when the level of the burst trigger signal 110 is low.

In some implementations, the optical switch 400 may select the second optical signal 310 when the level of the burst trigger signal 110 is high, and may select the first optical signal 210 when the level of the burst trigger signal 110 is low.

FIG. 1 shows the first optical signal 210 indicated by a solid line and the second optical signal 310 indicated by a dashed line switched therebetween by the optical switch 400 according to the burst trigger signal 110.

The first optical signal 210 and the second optical signal 310, which are switched by and output from the optical switch 400, are transmitted to the optical amplifier 500 to be amplified.

The optical amplifier 500 may be implemented using multiple stages of amplifiers connected to one another. The optical amplifier 500 may include an optical fiber amplifier or a laser crystal amplifier. More specifically, the optical amplifier 500 may be, but is not limited to, a single optical amplifier, a multi-stage optical fiber amplifier, a single crystal amplifier, a multi-stage crystal amplifier, a combination of a multi-stage optical fiber amplifier and a multi-stage crystal amplifier.

The first optical signal 210 and the second optical signal 310 having the same amplitude but different line-widths and polarization states are alternately output according to the burst trigger signal 110, to produce a mixed signal. The mixed signal is input to the optical amplifier 500. This allows for a temporally-coherent optical signal in the form of pulses. As a result, it is possible to overcome the above-mentioned problems such as damage to the optical amplifier 500 or instability of the laser system.

In other words, since a coherent optical signal in the form of pulses is input to the optical amplifier 500 according to the exemplary embodiment, no energy is accumulated in the gain medium of the optical amplifier 500. As a result, it is possible to prevent damage to an amplification stage and an optical system due to overamplification, and instability of laser output.

The optical signal amplified by the optical amplifier 500 is transmitted to the wavelength converter 600. The wavelength converter 600 is a wavelength converter that exploits non-linearity. In the wavelength converter 600 that exploits non-linearity, the wavelength of an optical pulse having a strong peak output and is polarized is efficiently converted. However, the wavelength of an optical pulse having a weak peak output is rarely converted.

In the wavelength converter 600 that exploits non-linearity, the efficiency of converting of a wavelength varies greatly depending on the size of an input light source and the size of a line-width and a polarization state of the input light source. In order to achieve a high efficiency of converting a wavelength, it is desirable that the intensity of the input light source is greater than a threshold intensity of non-linearity, the line-width of the input light source is smaller than a predetermined value, and that input light source is in a particular polarization state.

The essence of the present disclosure is utilization of the above-mentioned characteristics of the wavelength converter 600. That is, while the amplitude of the input light source is above a threshold amplitude for deriving non-linearity, the line-width and/or polarization state of the input light source is adjusted, so that the signal whose wavelength is converted by the non-linear wavelength converter 600 can be modulated into a burst-mode.

As described above, the first optical signal 210 has a narrow line-width and is polarized, and the second optical signal 310 has a broad line-width and is unpolarized.

Accordingly, the first optical signal 210 is output from the wavelength converter 600 with its wavelength converted, but the second optical signal 310 is rarely output from the wavelength converter 600 since it has low wavelength conversion efficiency. FIG. 1 shows output signals from the wavelength converter 600 along with the burst trigger signal 110.

Hereinafter, an operation of the apparatus 1 for generating burst-mode laser will be described.

As shown in FIG. 1, the first optical signal 210 from the first laser diode 200 that has a narrow oscillation line-width and is polarized or the second optical signal 310 from the second laser diode 300 that has broad oscillation line-width and is unpolarized are selected by the optical switch 400 according to the but trigger signal 110 input from an external device, and are amplified sequentially by the optical amplifier 500. The optical signals input to the optical amplifier 500 have different line-widths and different polarization states according to the burst trigger signal 110, and are maintained as optical signals in the form of temporally coherent pulses. As a result, it is possible to prevent damage to the optical amplifier 500 or instability of the laser system.

The final signal amplified by the optical amplifier 500 is input to the non-linear wavelength converter 600. The first optical signal 210 that has a narrow oscillation line-width and is polarized has a high efficiency of converting a wavelength, such that a strong optical signal whose wavelength is converted is output. The second optical signal 310 that has a broad oscillation line-width and is unpolarized has a low linear efficiency of converting a wavelength, such that its wavelength is not converted or converted to a signal having very small amplitude. As a result, a burst-mode can be implemented in a wavelength-tunable laser.

As described above, according to the exemplary embodiment of the present disclosure, the apparatus 1 for generating burst-mode laser can easily implement a burst-mode in a wavelength-tunable laser by adjusting an oscillation line-width and/or a polarization state of an oscillating light source. Accordingly, it is possible to prevent damage to the amplifier due to overamplification and instability in a laser output.

In addition, according to the exemplary embodiment of the present disclosure, it is not necessary to keep adjusting the magnitude of an output from a continuously-oscillating laser, which has to be done in an existing continuously-oscillating laser for compensating for gain differences in an optical fiber amplifier according to a burst duty ratio or a formation time In addition, since an all-optical fiber laser system can be manufactured, the apparatus may have all of the advantages that optical fiber laser systems have, such as good operation requirements, durability, compactness and lightness.

Furthermore, the apparatus has a simple configuration and thus is easy to manufacture. Accordingly, manufacturing cost can be saved and thus the apparatus is cost-efficient.

Hereinafter, a method for generating burst-mode laser according to an exemplary embodiment of the present disclosure will be described with reference to FIG. 2. The same elements as those described above with respect to the apparatus 1 for generating burst-mode laser according to the exemplary embodiment of the present disclosure will not be described again to avoid redundancy.

Figure 2:
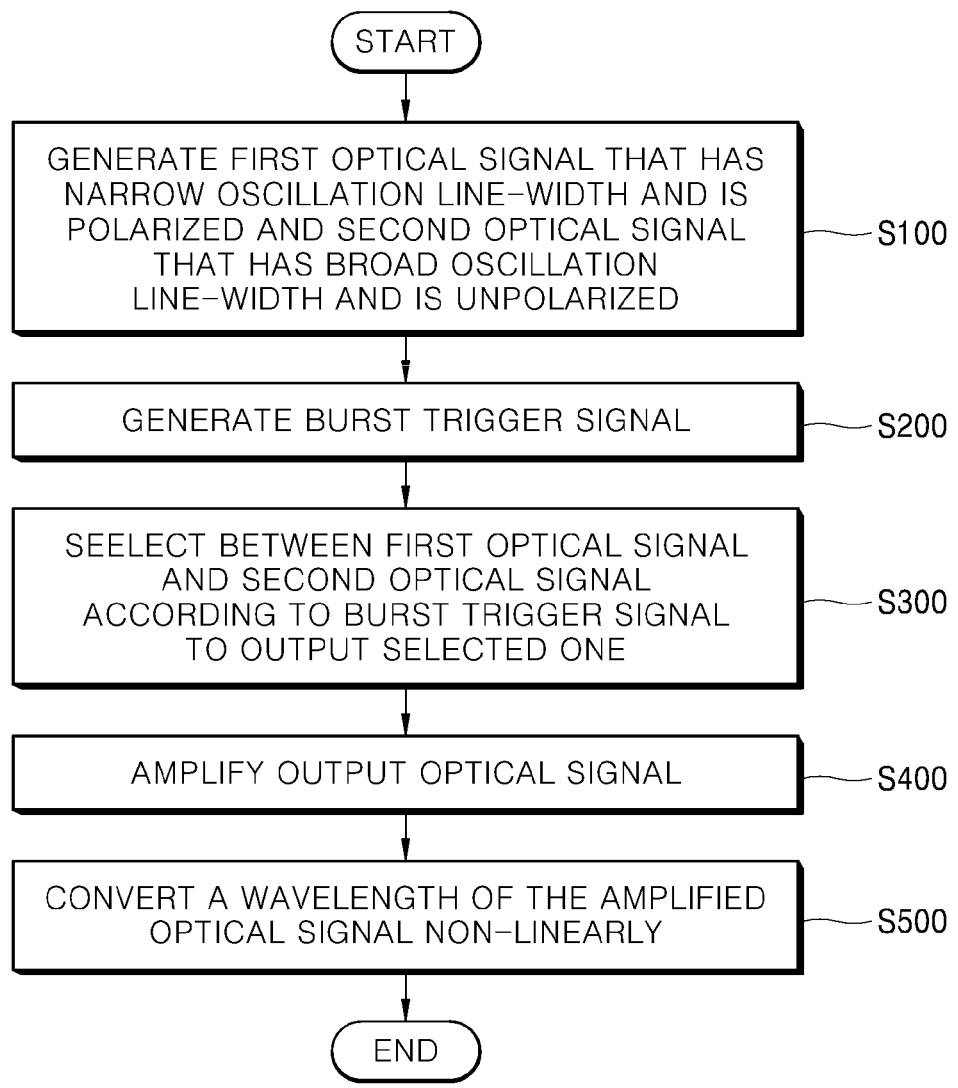
FIG. 2 is a flowchart for illustrating a method for generating burst mode laser according to an exemplary embodiment of the present disclosure.

FIG. 2 is a flowchart for illustrating a method for generating burst-mode laser according to an exemplary embodiment of the present disclosure.

Referring to FIG. 2, a method for generating burst-mode laser according to an exemplary embodiment of the present disclosure includes: (a) generating a first optical signal 210 that has a narrow oscillation line-width and is polarized and a second optical signal 310 that has a broad oscillation line-width and is unpolarized (step S100); (b) generating a burst trigger signal 110 (step S200); (c) selecting between the first optical signal 210 and the second optical signal 310 according to the burst trigger signal 110, to output the selected one (step S400); (d) amplifying the output optical signal (step S400); and (e) converting a wavelength of the amplified optical signal non-linearly (step S500)

In step S200, the burst trigger signal 110 is generated in the same form as a waveform of a desired burst-mode (random pulse train modulation).

In step S300, the first optical signal 210 is selected to be output when the level of the burst trigger signal 110 is high, and the second optical signal 310 is selected to be output when the level of the burst trigger signal 110 is low.

As the first optical signal 210 and the second optical signal 310 are mixed with each of according to the burst trigger signal 110 to produce a temporally-coherent optical signal in the form of pulses, the optical signal is amplified. Therefore, it is possible to overcome problems such as damage to the optical amplifier 500 due to overamplification or instability of a laser system.

As described above with respect to the apparatus for generating burst-mode laser according to the exemplary embodiment of the present disclosure, in step S500, the first optical signal 210 is output with its wavelength converted, but the second optical signal 310 is rarely output since it has low efficiency of converting a wavelength, due to the nature of non-linear converting of wavelength. Accordingly, it is possible to generate pulse laser in a burst mode conforming to the burst trigger signal 110.

As described above, according to the exemplary embodiment of the present disclosure, the method for generating burst-mode laser can easily implement a burst-mode in a wavelength tunable laser by adjusting an oscillation line-width and/or a polarization state of an oscillation light source. Accordingly, it is possible to prevent damage to the amplifier due to overload and instability in an laser output.

While the present disclosure has been illustrated and described in connection with the embodiments, it will be apparent to those skilled in the art that modifications and variations can be made without departing from the spirit and scope of the present disclosure as defined by the appended claims. Accordingly, the exemplary embodiments described herein are merely illustrative and are not intended to limit the scope of the present disclosure. The technical idea of the present invention is not limited by the exemplary embodiments. The scope of protection sought by the present disclosure is defined by the appended claims and all equivalents thereof are construed to be within the true scope of the present disclosure.

The invention claimed is:

1. An apparatus for generating burst-mode laser, comprising:
   a trigger signal generator for generating a burst trigger signal;
   a first light source for generating a first optical signal in a form of pulse;
   a second light source for generating a second optical signal in the form of pulse;
   an optical switch for selecting between the first optical signal and the second optical signal according to the burst trigger signal to output a selected optical signal;
   an optical amplifier for amplifying an optical signal output from the optical switch; and
   a wavelength converter for converting a wavelength of the optical signal amplified by the optical amplifier,
   wherein an oscillation line-width and/or a polarization state of the first optical signal is different from an oscillation line-width and/or a polarization state of the second optical signal,
   the optical switch is configured to:
   select the first optical signal to transmit it to the optical amplifier if a level of the burst trigger signal is logically high, and
   select the second optical signal to transmit it to the optical amplifier if the level of the burst trigger signal is logically low.

2. The apparatus of claim 1, wherein the first and the second light sources are laser diodes.

3. The apparatus of claim 2, wherein the first optical signal is polarized in an orientation, and the second optical signal is unpolarized.

4. The apparatus of claim 1, wherein the oscillation line-width of the first optical signal is narrower than that of the second optical signal.

5. The apparatus of claim 4, wherein the first optical signal is polarized in an orientation, and the second optical signal is unpolarized.

6. The apparatus of claim 4, wherein the line-width of the first optical signal is 1 nm or less, and the line-width of the second optical signal is 10 nm or more.

7. The apparatus of claim 6, wherein the first optical signal is polarized in an orientation, and the second optical signal is unpolarized.

8. The apparatus of claim 1, wherein the first optical signal is polarized in an orientation, and the second optical signal is unpolarized.

9. The apparatus of claim 1, wherein the wavelength converter is configured to tune the wavelength of the amplified optical signal non-linearly.

10. A method for generating burst-mode laser, the method comprising:
    (a) generating a first optical signal that has a narrow oscillation line-width and is polarized and a second optical signal that has a broad oscillation line-width and is unpolarized;
    (b) generating a burst trigger signal;
    (c) selecting between the first optical signal and the second optical signal according to the burst trigger signal, to output a selected optical signal;
    (d) amplifying an output optical signal; and
    (e) converting a wavelength of the amplified optical signal non-linearly,
    wherein (c) selecting between the first optical signal and the second optical signal comprises selecting the first optical signal to transmit it to the optical amplifier if a level of the burst trigger signal is logically high and selecting the second optical signal to transmit it to the optical amplifier if the level of the burst trigger signal is logically low.

11. The method of claim 10, wherein (b) generating a burst trigger signal comprises generating the burst trigger signal in the same form as a wavelength of a desired burst mode.

* * * * *